(12) United States Patent
Ingenbleek et al.

(10) Patent No.: US 7,745,739 B2
(45) Date of Patent: Jun. 29, 2010

(54) SEALING A CONTROLLER

(75) Inventors: Robert Ingenbleek, Kressbronn (DE); Michael Schwab, Markdorf (DE); Hubert Remmlinger, Friedrichshafen (DE); Oskar Schütz, Leingarten (DE); Andreas Rekofsky, Duggendorf (DE); Thomas Riepl, Bad Abbach (DE); Karl Smirra, Wasserburg (DE); Günter Lugert, München (DE)

(73) Assignees: ZF Friedrichshafen AG, Friedrichshafen (DE); Continental Automotive GmbH, Hannover (DE); Walter Sohner GmbH & Co. KG, Schwaigern (DE)

( * ) Notice: Subject to any disclaimer, the term of this patent is extended or adjusted under 35 U.S.C. 154(b) by 525 days.

(21) Appl. No.: 11/631,981

(22) PCT Filed: Jul. 6, 2005

(86) PCT No.: PCT/EP2005/007272
§ 371 (c)(1),
(2), (4) Date: Aug. 9, 2007

(87) PCT Pub. No.: WO2006/005489
PCT Pub. Date: Jan. 19, 2006

(65) Prior Publication Data
US 2008/0087463 A1 Apr. 17, 2008

(30) Foreign Application Priority Data
Jul. 9, 2004 (DE) .................. 10 2004 033 559

(51) Int. Cl.
*H01L 23/02* (2006.01)
*H05K 5/06* (2006.01)

(52) U.S. Cl. .................. 174/564; 174/521

(58) Field of Classification Search ............ 174/520, 174/521, 564, 560; 264/272.11; 257/787
See application file for complete search history.

(56) References Cited

U.S. PATENT DOCUMENTS

| | | | |
|---|---|---|---|
| 4,490,614 A | 12/1984 | Peerenboom et al. | |
| 4,546,412 A * | 10/1985 | Nakazawa et al. | 361/743 |
| 4,720,606 A * | 1/1988 | Senn | 174/356 |
| 4,893,215 A * | 1/1990 | Urushiwara et al. | 361/739 |
| 5,040,994 A | 8/1991 | Nakamoto et al. | |
| 5,134,546 A * | 7/1992 | Izumi et al. | 361/736 |
| 5,586,388 A * | 12/1996 | Hirao et al. | 29/830 |
| 6,573,447 B2 | 6/2003 | Trogisch et al. | |

(Continued)

FOREIGN PATENT DOCUMENTS

DE 26 17 965 10/1977

(Continued)

*Primary Examiner*—Hung V Ngo
(74) *Attorney, Agent, or Firm*—Davis & Bujold, P.L.L.C.

(57) ABSTRACT

A housing (1) with at least one electrical connection (7) through a housing wall (4) can be manufactured especially economically and can facilitate an especially economical lacing of electronic components (2, 13) present on the interior and on the exterior of the housing (1). The electrical connection (7) is enclosed by a housing material and additionally sealed by a sealing material (6). The sealing material (6) also advantageously serves to seal a top (3) and a bottom (5) to the housing wall (4). Through the combination of the casing of the electrical connection (7) of the housing (1) and the sealing material (6), this arrangement is, moreover, especially impervious to oil or other aggressive media.

16 Claims, 3 Drawing Sheets

U.S. PATENT DOCUMENTS

| | | |
|---|---|---|
| 6,766,817 B2 | 7/2004 | da Silva |
| 6,918,404 B2 | 7/2005 | da Silva |
| 7,066,586 B2 | 6/2006 | da Silva |
| 2002/0154486 A1* | 10/2002 | Koike et al. ................. 361/704 |
| 2006/0023431 A1 | 2/2006 | Wetzel |

FOREIGN PATENT DOCUMENTS

| | | |
|---|---|---|
| DE | 33 15 655 A1 | 11/1983 |
| DE | 689 21 445 T2 | 7/1995 |
| DE | 197 33 237 C1 | 5/1999 |
| DE | 100 39 110 A1 | 4/2001 |
| DE | 103 40 974 A1 | 3/2005 |
| EP | 0 375 271 A2 | 6/1990 |
| EP | 1 174 237 A1 | 1/2002 |
| GB | 1 583 191 | 1/1981 |

* cited by examiner

SEALING A CONTROLLER

This application is a national stage completion of PCT/EP2005/007272; filed Jul. 6, 2005, which claims priority from German Application Serial No. 10 2004 033 559.1; filed Jul. 9, 2004.

FIELD OF THE INVENTION

The invention concerns a housing for an electronic control device, as well as a method for manufacturing a housing.

BACKGROUND OF THE INVENTION

Control devices mostly feature a plurality of electronic components, which are connected to other components outside the control device. For protection against environmental influences or mechanical stresses control devices are normally installed in the housing. Furthermore, to facilitate the existence of a connection to components located outside the housing, an electrical connection from the housing interior to the housing exterior is necessary.

EP 0 375 271; B1; describes such a connection. This connection is constituted by a supporting plate on which track conductors are printed. The plate manufactured in this manner is applied at the connecting point between a housing and a top and sealed with solid seals to the housing and the top. An electrical component in the interior of the housing is connected via lead wires to the conductors printed on the supporting plate. Lead wires are, in turn, soldered to the printed track conductors on the exterior of the housing, which facilitates a connection to a component located outside.

The disadvantage of this arrangement is that the printed track conductors cannot be plugged in, and that they cannot be connected directly via a plug connection to further components. For this reason, many interfaces are necessary when printed track conductors are used, since the track conductors on the printed circuit board must connect to the respective electrical components via additional lead wires. Here, each interface represents a potential source of error. Moreover, the manufacture of a printed track conductor on a printed circuit board is cost intensive. Furthermore, the spatial arrangement of the interfaces can only be altered by a new printed circuit board. In addition, any connection of the printed circuit board to the respective electrical components, via lead wires, reacts susceptibly to vibrations.

DE 33 15 655; A1; describes an electrical connection using flexible track conductors. The flexible track conductors are applied to the connection points between the housing and a top and are, in turn, sealed through solid seals to the housing and top. The flexible track conductors can be routed from the connection point directly to the electrical component in the housing interior. In this way, the arrangement of the components is relatively flexible.

Although the use of flexible track conductors increases the variability of the arrangement of the electrical components, it is just as cost intensive. This connection also cannot be plugged into another component, thus necessitating the presence of an additional interface for each of the connected electrical components.

The objective of the invention is thus to make possible a housing with an electrical connection between a housing interior and a housing exterior that is economical, that facilitates a variable adaptation of the connection from components located outside the housing and keeps the number of interfaces to a minimum. Moreover, the electrical connection should be made to be especially oil tight, even at high temperatures.

SUMMARY OF THE INVENTION

The invention proposes fixedly encapsulating by coating or sleeving an electrical connection to the housing wall between a housing interior and a housing exterior. Moreover, the housing wall features a cavity through which the electrical connection is routed. In order to ensure an oil tight sealing even with use under high temperatures, the sealing material is additionally introduced into this cavity. This sealing material encloses the electrical connection and seals the bushing of the electrical connection through the housing wall. At the same time, however, the sealing material provides additional functions. First, the electrical connection is sealed off through the housing wall. Second, the sealing of the housing wall to the top and/or bottom is facilitated by the sealing material. Depending upon its properties, the sealing material can also serve to cement the housing wall to the top and/or bottom. The use of a punch grid for the electrical connection is especially advantageous. A punch grid consists of track conductors that are advantageously stamped out of a flat, electrically conductive material and can be manufactured very economically. This punch grid can be directly encapsulated or sleeved by the housing wall in accordance with the invention. In an especially advantageous manner, the housing wall is, moreover, constructed as double-walled and the sealing material is stuffed into the space between the walls.

This advantageous punch grid can be advantageously connected directly to individual components on the housing interior side. Moreover, punch grids are generally pluggable, which means that they can be used directly as contacts in a plug connection. Thus the punch grid can be directly enclosed with a plug connector, for example on the housing exterior. This plug connector can, in turn, be directly encapsulated or sleeved by the housing wall. In this way, the number of interfaces is minimized and free track conductors can be avoided. With the punch grid, other components, such as sensors or actuators, can likewise be connected on the housing exterior and can also be encapsulated or sleeved by the housing wall.

In accordance with the invention, the housing is manufactured with an electrical connection; advantageously a punch grid, being inserted into an injection or pressing tool as the first step. The housing wall is then encapsulated or sleeved around this electrical connection. The housing wall features a cavity through which the electrical connection is routed. The housing wall is constructed as double-walled in an advantageous configuration. In a further step, the sealing material is then filled in around the electrical connection in the cavity of the housing wall. The sealing material can be applied through, for example, injection, casting, dipping or spraying. Moreover, the action of capillary forces is also facilitated in this manner.

The housing wall can be connected to a top and/or a bottom. This connection can be produced conventionally through screws or rivets. Moreover, depending upon its characteristics, the sealing material is inherently used to cement the top and/or the bottom to the housing wall. A further advantageous configuration provides for a snap connection between the housing wall and the top and/or bottom, wherein the top and/or bottom can also be welded to a bottom or top. It is also possible to construct the housing wall as one piece with a bottom or top. The top and/or the bottom can moreover be outfitted with a rotating bar. During the process of connecting the housing wall to the top and/or bottom, this bar is pressed into the sealing material, thereby facilitating a sealing of the housing.

A plug connector can also be applied on the end of the punch grid located on the exterior of the housing. This plug connector can be encapsulated or sleeved directly by the housing wall through the inventive process for manufacturing the housing wall. Since the position of the electrical connection in the housing wall is not prescribed, the position of the connection can be varied in an especially simple manner.

In summary, a housing with an electrical connection through a housing wall is proposed that is especially economical to manufacture and facilitates an especially variable connection of the electronic components located on the interior and the exterior of the housing. Through the combination of enclosing the electrical connection of housing and sealing material, this arrangement is especially tightly sealed against oil or other aggressive media. Moreover, the housing of the invention is especially temperature-resistant. It can be used advantageously in a temperature range from −40° C. to +180° C. Furthermore, the housing of the invention also serves as a chip protection for the enclosed elements.

BRIEF DESCRIPTION OF THE DRAWINGS

The invention will now be described, by way of example, with reference to the accompanying drawings in which.

DETAILED DESCRIPTION OF THE INVENTION

Figure 1:
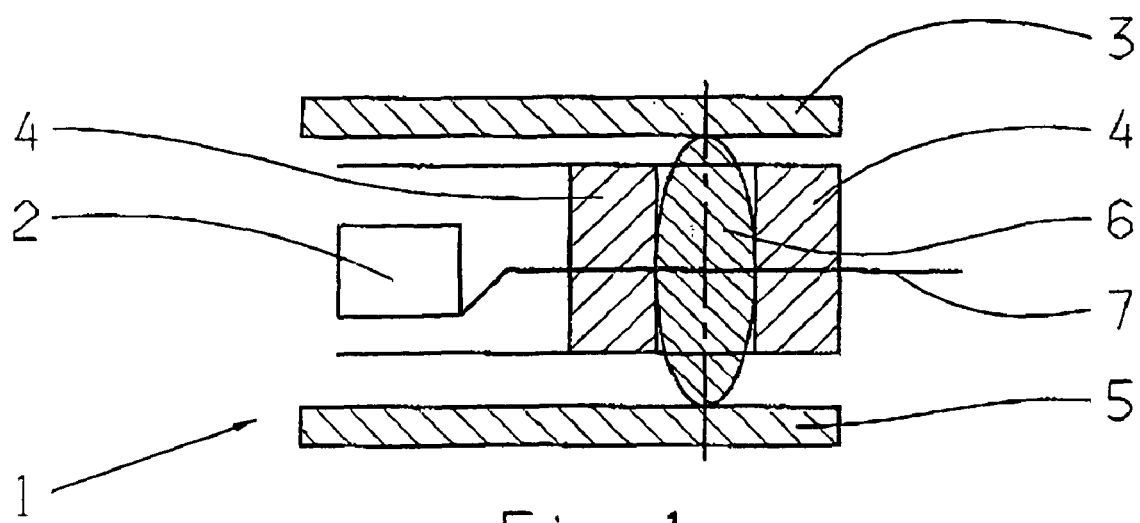
FIG. 1 illustrates a housing covered by sealing material.

FIG. 1 shows a cross-section of a housing 1 for an electronic device 2 with a top 3, a double-walled housing wall 4 and a bottom 5. A sealing material 6 is introduced into a cavity of the double-walled housing wall 4. An electrical connection 7 from the housing interior to the housing exterior is tightly enclosed by the double-walled housing wall 4, as well as by the sealing material 6. The top 3 and the bottom 5 can be connected fixedly to the housing wall 4. This can, for example, take place through a conventional riveting or also through a cementing or screwing step. Here the sealing is made possible through the sealing material 6, which projects from the double-walled housing wall 4 in the direction toward the top 3 and the bottom 5. During connection of the housing parts, the sealing material 6 seals the bottom 5 or the top 3 against the housing wall 4. In this way, an especially simple and economical sealing of the housing 1 can be achieved. The electrical connection 7 is advantageously a punch grid. A punch grid corresponds to electrical leads, which are directly stamped out of an electrically conductive material. The electronic device 2 can be directly connected to the punch grid. This punch grid is moreover so stiff that it requires no further supporting material and can be manufactured very economically.

Figure 2:
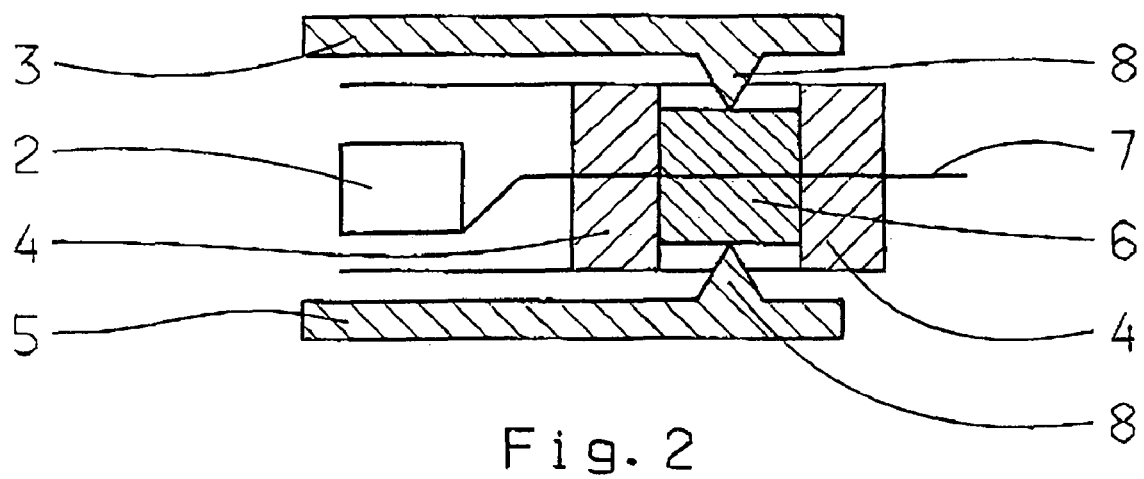
FIG. 2 illustrates a housing with bar in top and bottom.

FIG. 2 illustrates a further advantageous configuration of the housing 1. The sealing material 6 here does not project out of the housing wall 4. The additional sealing function of the sealing material 6 between the housing wall 4 and the top 3 and the bottom 5 is achieved by a rotary bar 8 applied on the top 3 and the bottom 5. Following the connection of the top 3 and bottom 5 to the housing wall 4 this presses into the sealing material 6 such that the latter is deformed and an oil-tight sealing of the housing exists.

Figure 3:
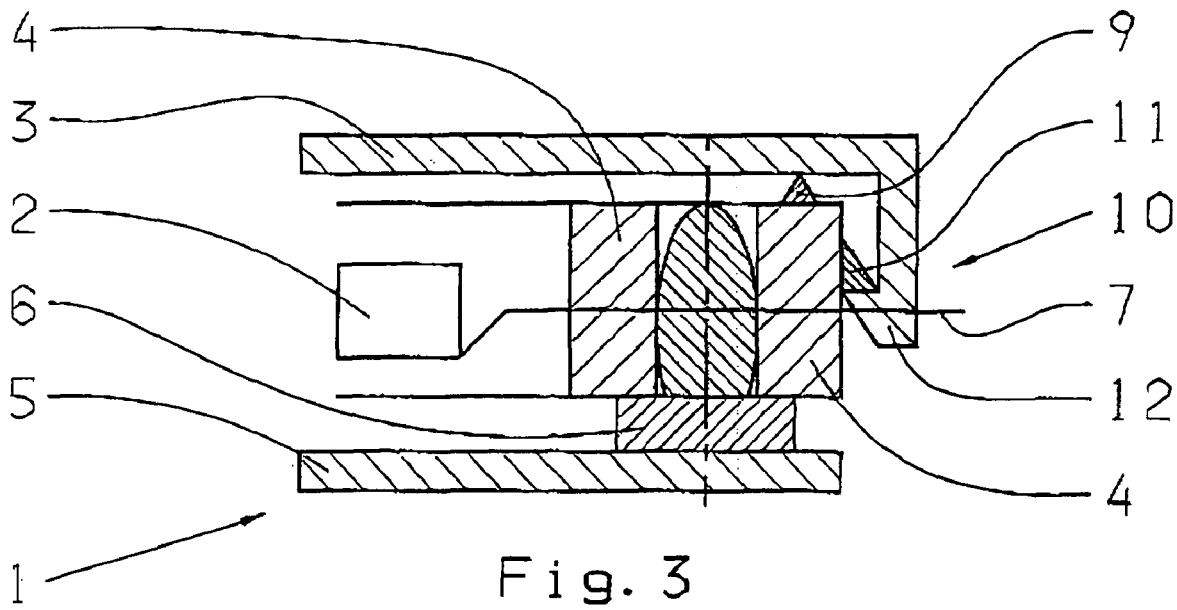
FIG. 3 illustrates a housing with snap lock.

FIG. 3 illustrates a further configuration of a housing 1 of the invention. Here the sealing material 6 projects from the housing wall 4 on the side directed toward the bottom 5. Owing to its properties, the sealing material 6 cements the housing wall 4 to the bottom 5. The top 3 and the housing wall 4 are connected through a snap connection 10. The snap connection 10 consists of a nose 11 on the housing wall 4, as well as a corresponding nose 12 on the top 3. When the top 3 and the housing wall 4 are joined, the nose 12 snaps over the nose 11 and thereby connects the top 3 with the housing wall 4. This, in turn, is more economical than a conventional connection, since additional connection means are not required in this case. The top 3 is sealed against the housing wall 4 with a sprayed on sealing 9 against the housing wall 4, but can also be sealed against the housing wall 4 with an inserted solid seal. The sprayed on sealing 9, however, is more economical than an inserted solid seal.

Figure 4:
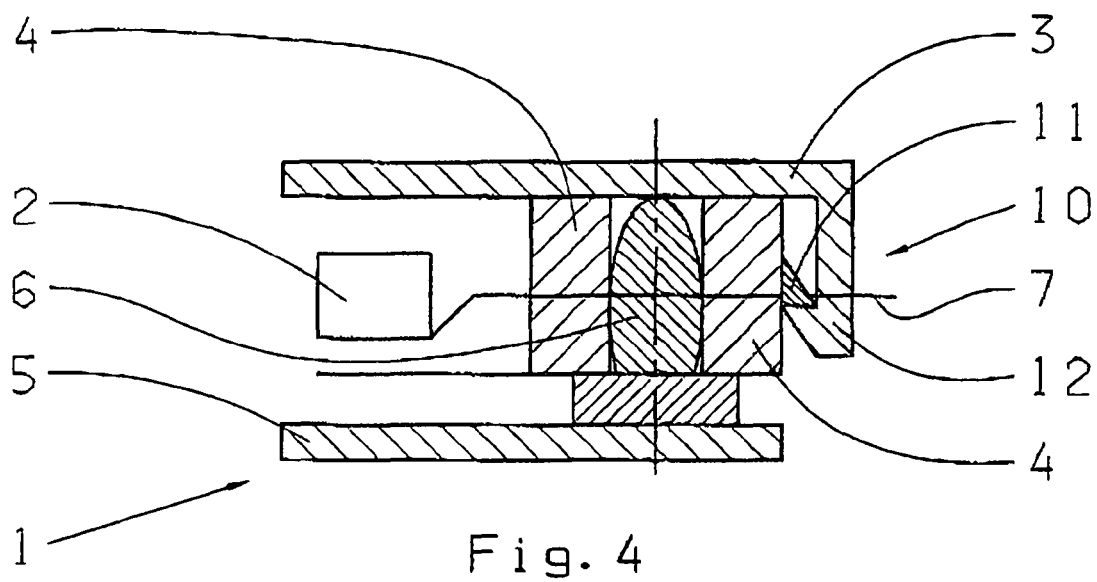
FIG. 4 illustrates a housing with snap lock.

FIG. 4 shows a housing identical to FIG. 3 in every way except for the seal and additional connection of the top 3 with the housing wall 4. Here the snap connection 10 serves to fix the top 3 onto the housing wall 4. The top 3 is directly welded to the housing wall 4 or glued with an additional adhesive to be applied. In this way, an additional seal is not necessary.

Figure 5:
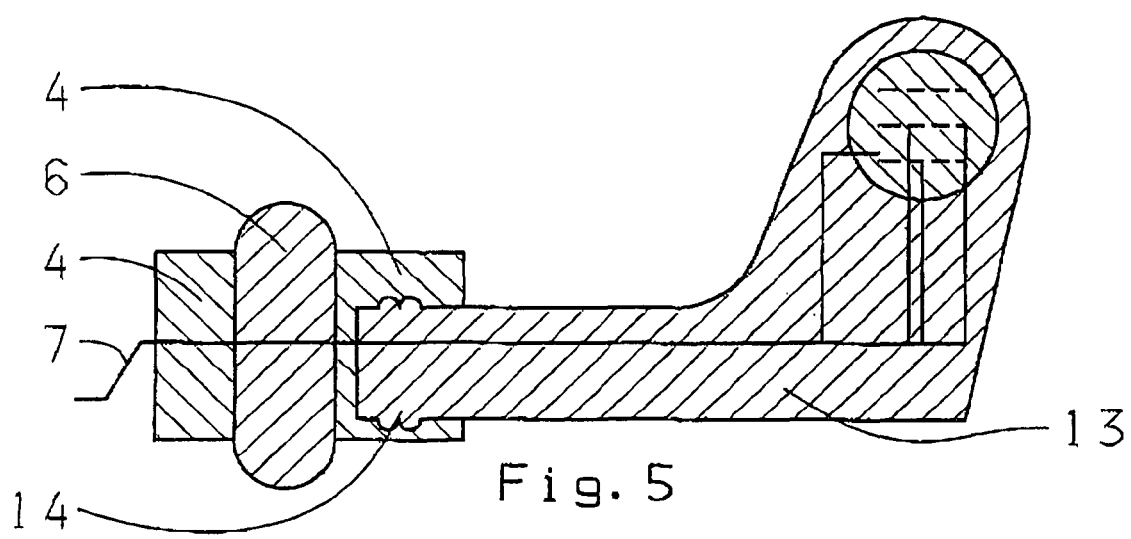
FIG. 5 illustrates a housing wall with integrated plug connection.

FIG. 5 illustrates a plug connector 13 that is connected directly to the electrical connection 7. The plug connector 13 features a profiling 14 on its side facing the housing wall 4. The plug connector 13 is directly encapsulated by the housing wall 4 and is secured against loosening by its profiling 14. With such a construction, no open track conductors of the electrical connection 7 are present any more. This is advantageous, above all, for protection of the electrical connection 7 from mechanical stress. Other modules, such sensors or actuators, can be connected in this way to the electrical connection 7 and integrated into the housing wall 4.

Figure 6:
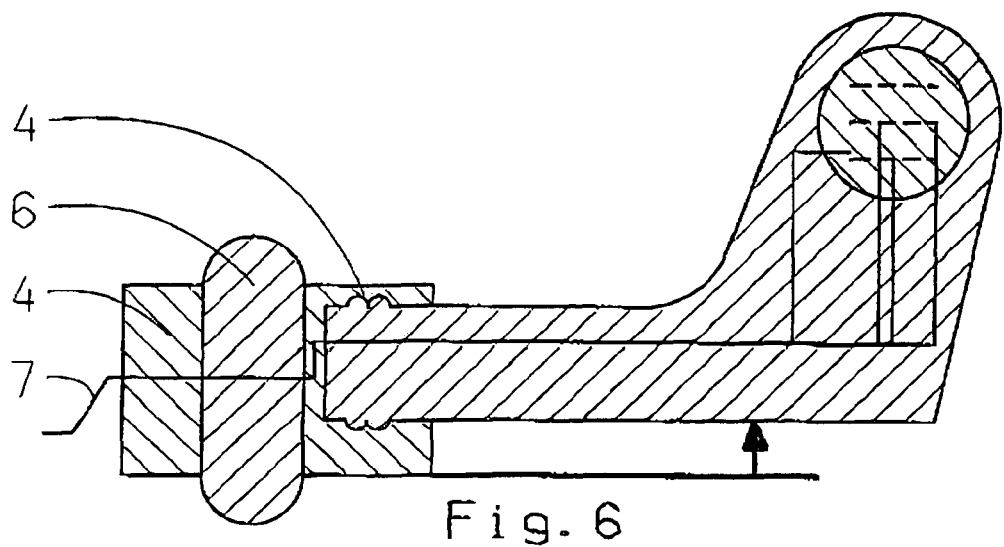
FIG. 6 illustrates a housing wall with integrated plug connection.

FIG. 6 illustrates an adaptation of the embodiment of the plug connection 13 in the housing wall 4. Through the inventive method, the plug connection 13 can be brought without great effort into a modified position without a new injection or pressing tool having to be manufactured and without the sealing having to be adapted. This is possible, since no exactly predetermined spot for the routing of the electrical connection 7 through the housing wall 4 is necessary. As long as the plug connection 13 can be encapsulated or sleeved by the housing wall, a corresponding embodiment is possible. In this way, an alteration of the embodiment of the different components, such as a plug connection 13, in relation to the housing 1, is possible in a simple and economical manner.

Figure 7:
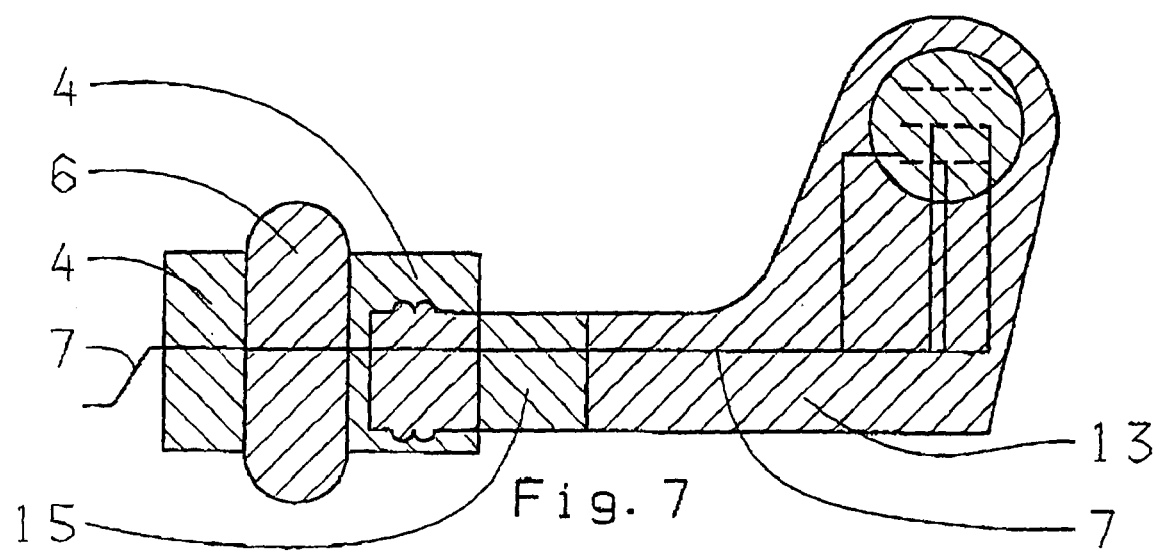
FIG. 7 illustrates a housing wall with integrated plug connection.
Figure 8:
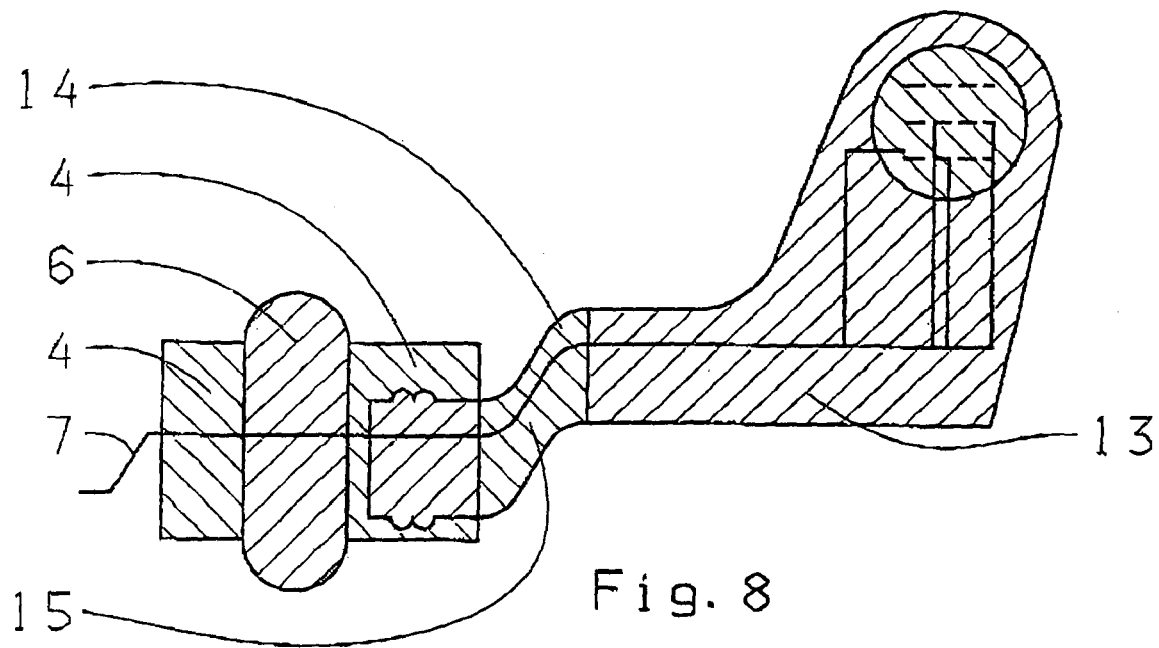
FIG. 8 illustrates a housing wall with integrated plug connection.

FIG. 7 shows a plug connection 13 encapsulated or sleeved by the housing wall 4 that can be altered after the spraying or injection process. This is possible since a part of the plug connector 13 consists of an elastic material 15. FIG. 7 depicts the plug connection 13 in an initial position, while FIG. 8 shows the same plug connection 13 with a vertically adapted position. Of course, a horizontal variation is also possible.

REFERENCE NUMERALS 1 housing
2 electronic device
3 top
4 housing wall
5 bottom
6 sealing material 7 electrical connection
8 bar
9 sprayed on sealing
10 snap connection
11 nose
12 nose
13 plug connection
14 profiling
15 elastic material

The invention claimed is:

1. A housing (1) for an electronic device, the housing comprising:
   an electrical connection (7) communicating with the electronic device within an interior of the housing and extending to an exterior of the housing;
   a double-walled housing wall one of fixedly encapsulating or surrounding the electrical connection (7);
   a cavity in the housing wall (4), the electrical connection (7) passing through the cavity in the housing wall (4) to the exterior of the housing; and
   a sealing material (6) located within the cavity for sealing the passage of the electrical connection (7), the sealing material (6) projecting from the cavity in the housing wall toward at least one of a housing top (3) and a housing bottom (5) and is sandwiched between the housing wall (4) and at least one of the housing top (3) and the housing bottom (5).

2. The housing (1) according to claim 1, wherein the cavity Is defined by an area between the double-wall of the housing (1), the sealing material (6) being located within the cavity between the double-walls.

3. The housing (1) according to claim 1, wherein the one or more of the top (3) and the bottom (5) are connected to the housing wall (4).

4. The housing (1) according to claim 1, wherein the sealing material (6) forms a seal between one or more of the housing top (3) and the housing wall (4) and the housing bottom (5) and the housing wall (4).

5. The housing (1) according to claim 1, wherein the one or more of the housing top (3) and the housing bottom (5) have a rotary bar (8), which presses into the sealing material (6) after the one or more of the housing top (3) and the housing bottom (5) have been connected to the housing wall (4), thus sealing the housing (1).

6. The housing (1) according to claim 1, wherein the sealing material (6) that projects beyond the housing wall (4) in a direction toward the one or more of housing top (3) and the housing bottom (5) is utilized as an adhesive for connecting the one or more of the housing top (3) and the housing bottom (5) to the housing wall (4).

7. The housing (1) according to claim 1, wherein the one or more of the housing top (3) and the housing bottom (5) are connected to the housing wall (4) via a snap lock (10).

8. The housing (1) according to claim 7, wherein the one or more of the housing top (3) and the housing bottom (5) are one of glued and welded to the housing wall (4).

9. The housing (1) according to claim 1, wherein the electrical connection (7) is a punch grid.

10. The housing (1) according to claim 9, wherein the punch grid (7) has a housing of a plug connection (13) at an end located exterior of the housing, the housing wall (4) directly encapsulating and sleeving the plug connection (13).

11. The housing (1) according to claim 1, wherein the electronic device is a transmission control of a motor vehicle.

12. A method for manufacturing a housing (1) for an electronic device, the housing having an electrical connection (7) communicating with the electronic device within an interior of the housing and extending to an exterior of the housing, a double-walled housing wall one of fixedly encapsulating or sleeving the electrical connection (7), a cavity in the housing wall (4), the electrical connection (7) passing through the cavity in the housing wall (4) to the exterior of the housing and a sealing material (6) located within the cavity for sealing the passage of the electrical connection (7), the sealing material (6) projecting from the cavity in the housing wall toward at least one of a housing top (3) and a housing bottom (5) and being sandwiched between the housing wall (4) and at least one of the housing top (3) and the housing bottom (5), the method comprising the steps of:
   inserting the electrical connection (7) into one of an injection mold and pressing mold, to one of encapsulate or sleeve the electrical connection (7) within a housing wall (4);
   stuffing the sealing material (6) into the cavity of the housing wall (4) through which the electrical connection (7) passes; and
   connecting the housing wall (4) to the one or more of the housing top (3) and the housing bottom (5).

13. The method according to claim 12, further comprising the step of spraying a sealing lip (9) onto the housing wall (4).

14. The method according to claim 12, further comprising the step of one of screwing, gluing, riveting and welding the housing wall (4) to the one or more of the housing top (3) and the housing bottom (5).

15. The method according to claim 12, further comprising the step of one of directly encapsulating and sleeving a plug connection (13) to a punch grid (7), by the housing wall (4).

16. A housing (1) for an electronic apparatus (2), the housing comprising:
   a cover (3), a base (5) and a double-walled housing wall (4) that is arranged between the cover (3) and the base (5);
   a cavity being formed between the two walls of the double-walled housing wall (4);
   at least one electrical connection (7) extending through the housing wall (4) and the cavity from an interior side of the housing wall (4) to an exterior side of the housing wall (4) such that the at least one electrical connection (7) is either encapsulated or surrounded by the housing wall (4);
   the cavity being filled with a sealing material (6) for sealing off the at least one electrical connection (7), and
   each of the cover (3) and the base (5) having a peripheral web (8) which projects into the cavity and the sealing material (6) to seal the cover (3) and the base (5) from the double-walled housing wall (4).

\* \* \* \* \*